United States Patent
Pflueger

(10) Patent No.: US 7,403,384 B2
(45) Date of Patent: Jul. 22, 2008

(54) THERMAL DOCKING STATION FOR ELECTRONICS

(75) Inventor: John C. Pflueger, Austin, TX (US)

(73) Assignee: Dell Products L.P., Round Rock, TX (US)

(*) Notice: Subject to any disclaimer, the term of this patent is extended or adjusted under 35 U.S.C. 154(b) by 69 days.

(21) Appl. No.: 11/460,161

(22) Filed: Jul. 26, 2006

(65) Prior Publication Data

US 2008/0024992 A1    Jan. 31, 2008

(51) Int. Cl.
H05K 7/20     (2006.01)
H05K 5/00     (2006.01)

(52) U.S. Cl. ............... 361/688; 361/687; 361/689; 361/699; 361/727; 165/104.21; 165/104.33; 62/3.2; 62/3.3

(58) Field of Classification Search ......... 361/679–727, 361/732, 736; 62/3.2, 3.3, 3.7, 332, 259.2; 174/15.1, 152; 165/104.21, 104.26, 104.33, 165/80.4, 185; 257/714, 715

See application file for complete search history.

(56) References Cited

U.S. PATENT DOCUMENTS

| | | | |
|---|---|---|---|
| 5,526,874 A | 6/1996 | White | |
| 5,704,212 A | 1/1998 | Erler et al. | |
| 5,711,155 A * | 1/1998 | DeVilbiss et al. ............. | 62/3.7 |
| 6,109,039 A * | 8/2000 | Hougham et al. ............. | 62/3.7 |
| 6,181,553 B1 * | 1/2001 | Cipolla et al. ................ | 361/687 |
| 6,191,943 B1 | 2/2001 | Tracy | |
| 6,229,704 B1 | 5/2001 | Hoss et al. | |
| 6,362,959 B2 | 3/2002 | Tracy | |
| 6,415,612 B1 * | 7/2002 | Pokharna et al. ............. | 62/3.2 |
| 6,434,001 B1 | 8/2002 | Bhatia | |
| 6,445,580 B1 | 9/2002 | Cohen et al. | |
| 6,462,949 B1 * | 10/2002 | Parish et al. ................. | 361/699 |
| 6,536,510 B2 * | 3/2003 | Khrustalev et al. ...... | 165/104.33 |
| 6,560,104 B2 | 5/2003 | DeHoff et al. | |
| 6,643,132 B2 * | 11/2003 | Faneuf et al. ................ | 361/700 |
| 6,657,262 B2 * | 12/2003 | Patti ........................... | 257/370 |
| 6,693,797 B2 * | 2/2004 | Faneuf et al. ................ | 361/689 |
| 6,705,089 B2 * | 3/2004 | Chu et al. ..................... | 62/3.2 |
| 6,796,372 B2 * | 9/2004 | Bear ........................ | 165/104.21 |
| 6,807,056 B2 * | 10/2004 | Kondo et al. ................. | 361/689 |
| 6,829,142 B2 * | 12/2004 | Belady et al. ................ | 361/687 |
| 6,836,407 B2 * | 12/2004 | Faneuf et al. ................ | 361/687 |
| 6,837,057 B2 | 1/2005 | Pokharna et al. | |
| 6,917,522 B1 | 7/2005 | Erturk et al. | |
| 7,012,807 B2 * | 3/2006 | Chu et al. ..................... | 361/699 |
| 7,050,299 B2 * | 5/2006 | Kondo et al. ................. | 361/689 |
| 7,120,021 B2 * | 10/2006 | Hamman ..................... | 361/699 |
| 7,133,283 B2 * | 11/2006 | Faneuf et al. ................ | 361/689 |
| 7,187,550 B1 * | 3/2007 | Heydari et al. .............. | 361/699 |

(Continued)

Primary Examiner—Michael V Datskovskiy
(74) Attorney, Agent, or Firm—Haynes and Boone, LLP

(57) ABSTRACT

For transferring heat generated by an electronic device, a component heat exchanger is thermally coupled to the electronic device. A component-side thermal interface is thermally coupled to the component heat exchanger by a heat conductor. A rack-side thermal interface is thermally coupled to the component-side thermal interface to transfer the heat from the component-side thermal interface to a heat exchanger. A thermoelectric cooler (TEC) is thermally coupled in series with at least one of the component-side thermal interface and rack-side thermal interface. The TEC is operable to increase an amount of the heat transferred from the electronic device to the heat exchanger in response receiving an electrical input.

18 Claims, 6 Drawing Sheets

U.S. PATENT DOCUMENTS 7,233,491 B2 * 6/2007 Faneuf et al. ............... 361/689
7,293,416 B2 * 11/2007 Ghoshal ...................... 62/3.7
2006/0034053 A1 * 2/2006 Parish et al. ................ 361/699

* cited by examiner

THERMAL DOCKING STATION FOR ELECTRONICS

BACKGROUND

The present disclosure relates generally to information handling systems, and more particularly to improved heat removal in an information handling system (IHS).

As the value and use of information continues to increase, individuals and businesses seek additional ways to process and store information. One option is an IHS. An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, entertainment, enterprise data storage, or global communications. In addition, IHSs may include a variety of hardware and software components that may be configured to process, store, and communicate information and may include one or more computer systems, data storage systems, and networking systems.

As IHSs increase in speed and shrink in size, power consumed within the IHS per unit volume (power density) increases dramatically. Thus, it has become increasingly important to dissipate the heat generated by one or more components within the IHS during operation, thereby ensuring that each one of the components remains within the normal operating temperature range. A heat removal system thus reduces a chance that the components will fail due to overheating. Traditional techniques for removing heat generated by one or more components of the IHS include use of passive and/or active cooling systems. Example of a passive heat removal system may include a heat sink, and an example of an active heat removal system may include a cooling fan.

Passive heat removal systems may also include heat pipes that are used in conjunction with the heat sinks. The heat pipes are thermal conductors that conduct heat away from a heat-generating component such as a processor fitted with a heat sink to a rack cooling system. Some heat removal systems may include pipes to transport liquid coolant from a heat source to the heat sink. A chassis of the IHS is often used as a heat sink with heat pipes conducting heat from the internal components to the chassis.

However, some of the traditional heat removal tools and techniques may often generate excessive acoustical noise due to use of rotating devices such as blower fans. Some other traditional heat removal tools and techniques may be difficult for servicing/maintenance of electronic devices due to presence of pipe fittings and/or couplings carrying coolant fluids. Thus, many of the traditional heat removal tools and techniques may degrade user experience.

SUMMARY

Applicants recognize an existing need for improved heat removal that transfers an increased amount of heat, reduces acoustical noise, and facilitates serviceability of the electronic devices that generate the heat, absent the disadvantages found in the prior techniques discussed above.

The foregoing need is addressed by the teachings of the present disclosure, which relates to increasing an amount of heat removed from a heat source. According to one embodiment, in a method and system for transferring heat generated by an electronic device, a component heat exchanger is thermally coupled to the electronic device. A component-side thermal interface is thermally coupled to the component heat exchanger by a heat conductor. A rack-side thermal interface is thermally coupled to the component-side thermal interface to transfer the heat from the component-side thermal interface to a heat exchanger. A thermoelectric cooler (TEC) is thermally coupled to at least one of the component-side thermal interface and rack-side thermal interface. The TEC is operable to increase an amount of the heat transferred from the electronic device to the heat exchanger in response receiving an electrical input.

In one aspect, a method for transferring heat generated by an electronic device includes providing a heat exchanger thermally coupled to the electronic device. The heat from the heat exchanger is transferred to a component-side thermal interface via a heat conductor. Electrical energy is provided to a TEC thermally coupled to the component-side thermal interface, whereby the electrical energy causes a reduction in a temperature of the component-side thermal interface due to the thermoelectric effect. An increased amount of the heat is transferred in response to the reduction in the temperature, compared to the heat transferred without the TEC.

Several advantages are achieved according to the illustrative embodiments presented herein. The embodiments advantageously provide an improved heat transfer system that is capable of transferring an increased amount of heat from electronics components to a centralized cooling system. The increased amount of the heat is generated by advantageously deploying a TEC, which facilitates a reduction in the temperature of the heat source. The user experience is improved by virtually eliminating acoustical noise generated by rotating cooling devices such as blower fans. In addition, the user experience is also improved by use of thermal bridges and fluid-less thermal interfaces to transfer heat from local components and heat exchangers to the central heat exchanger. The thermal bridge and fluid-less thermal coupling may be easily connected or disconnected for easier servicing of the electronic devices. The serviceability of the electronic devices is further improved by use of flexible tubing, which enables the component-side thermal interface and rack-side thermal interface to be freely moved along rails without disrupting the coolant fluid flow.

DETAILED DESCRIPTION

Figure 1:
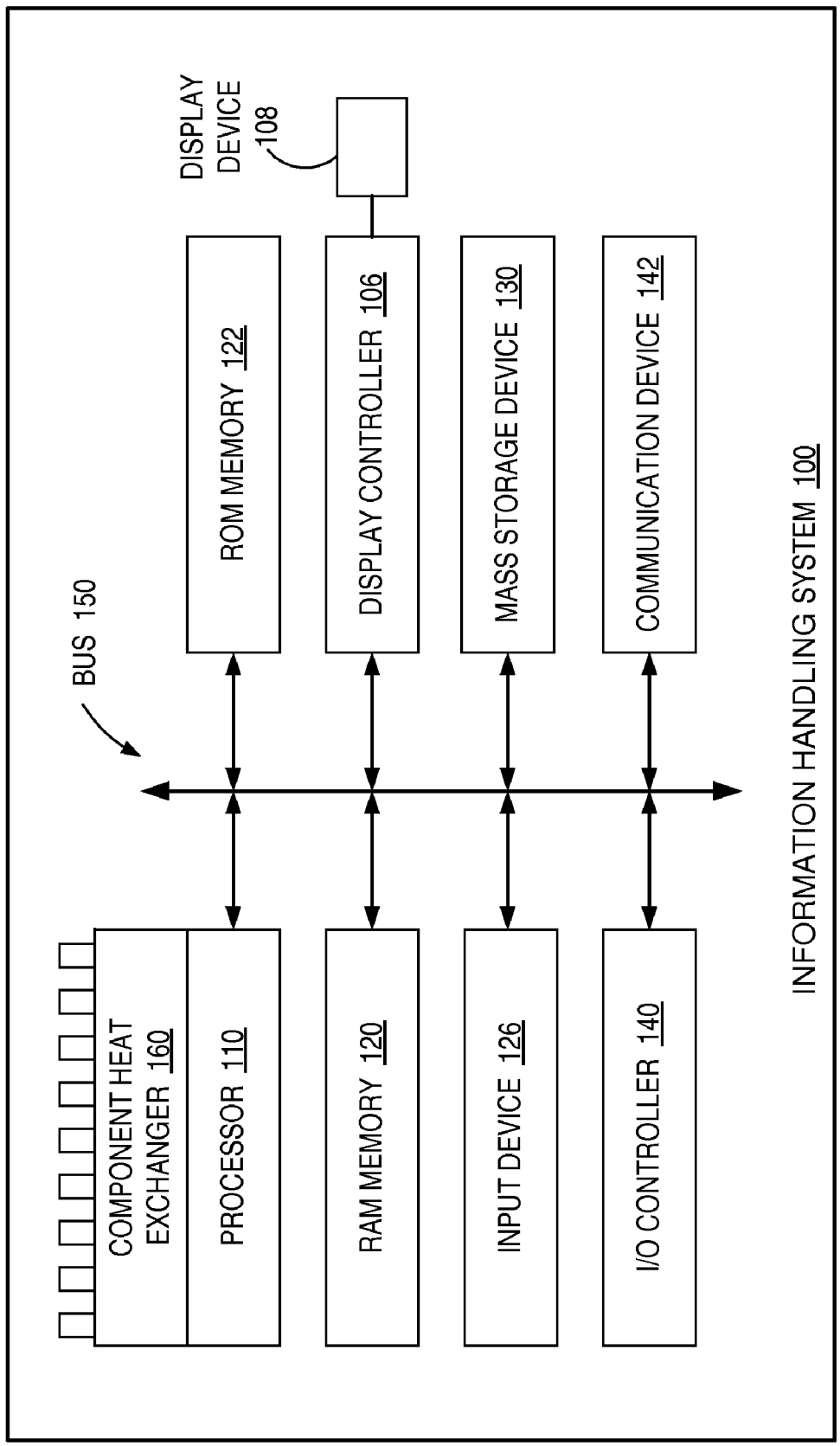
FIG. 1 illustrates a block diagram of an IHS, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices, boards, cards, modules, blocks, and/or components described herein may be implemented as hardware (including discrete components, integrated circuits and systems-on-a-chip 'SOC'), firmware (including application specific integrated circuits and programmable chips) and/or software or a combination thereof, depending on the application requirements. Similarly, the functionality of various mechanical elements, members, and/or components for forming modules, sub-assemblies and assemblies assembled in accordance with a structure for an apparatus may be implemented using various materials and coupling techniques, depending on the application requirements.

As described earlier, traditional heat removal tools and techniques may often generate excessive acoustical noise due to use of rotating components such as blower fans. Some other traditional heat removal tools and techniques may be difficult for servicing/ maintenance of electronic devices due to presence of pipe fittings and/or couplings carrying coolant fluids. Thus, many of the traditional heat removal tools and techniques may degrade user experience. Therefore, a need exists for a method and system for heat removal that transfers an increased amount of heat, reduces acoustical noise, and facilitates serviceability of the electronic devices that generate the heat. According to one embodiment, for transferring heat generated by an electronic device, a component heat exchanger is thermally coupled to the electronic device. A component-side thermal interface is thermally coupled to the component heat exchanger by a heat conductor. A rack-side thermal interface is thermally coupled to the component-side thermal interface to transfer the heat from the component-side thermal interface to a heat exchanger. A TEC is thermally coupled to at least one of the component-side thermal interface and rack-side thermal interface. The TEC is operable to increase an amount of the heat transferred from the electronic device to the heat exchanger in response receiving an electrical input.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the IHS may be a personal computer, including notebook computers, personal digital assistants, cellular phones, gaming consoles, a server, a network storage device, or any other suitable device and may vary in size, shape, performance, functionality, and price. The IHS may include random access memory (RAM), one or more processing resources such as central processing unit (CPU) or hardware or software control logic, read only memory (ROM), and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to receive/ transmit communications between the various hardware components.

FIG. 1 illustrates a block diagram of an IHS 100, according to an embodiment. The IHS 100 includes a processor 110, which is coupled to a bus 150. The bus 150 serves as a connection between the processor 110 and other components of the IHS 100. An input device 126 is coupled to the processor 110 to provide input to the IHS 100. Examples of input devices may include keyboards, touchscreens, and pointing devices such as mouses, trackballs and trackpads. Software programs, including instructions, and data are stored on a mass storage device 130, which is coupled to processor 110 via the bus 150. Mass storage devices may include such devices as hard disks, optical disks, magneto-optical drives, floppy drives and the like. The IHS system 100 further includes a display controller 106 to generate displays that are displayable on a display device 108, the display controller 106 being coupled to the processor 110 by the bus 150. A system memory 120, which may also be referred to as RAM or main memory, is coupled to the processor 110 to provide the processor with fast storage to facilitate execution of computer programs by the processor 110. Although the IHS 100 is shown to include one processor, e.g., the processor 110, additional processors may be included to process additional I/O.

In an exemplary, non-depicted embodiment, a chassis or a rack houses the main electronic components of the computer system, including a motherboard (also referred to as a planar module), power supply, cooling system, and optional cards, such as interface boards that provide audio, video and/or networking capabilities. It should be understood that other buses and intermediate circuits can be deployed between the components described above and processor 110 to facilitate interconnection between the components and the processor 110.

The IHS 100 may also include a non-volatile ROM 122 memory, an I/O controller 140 for controlling various other I/O devices. For example, the I/O controller 140 may include a serial and/or parallel I/O bus controller. It should be understood that the term "information handling system" is intended to encompass any device having a processor that executes instructions from a memory medium.

The IHS 100 is shown to include the mass storage device 130 connected to the processor 110, although some embodiments may not include the mass storage device 130. In a particular embodiment, the IHS 100 may include additional hard disks. The bus 150 may include data, address and control lines. In an exemplary, non-depicted embodiment, not all devices shown may be directly coupled to the bus 150. In one embodiment, the IHS 100 may include multiple instances of the bus 150. The multiple instances of the bus 150 may be in compliance with one or more proprietary standards and/or one or more industry standards such as peripheral component interconnect (PCI), PCI express (PCIe), industry standard architecture (ISA), universal serial bus (USB), system management bus (SMBus), and similar others. A communication device 142, such as a network interface card and/or a radio device, may be connected to the bus 150 to enable wired and/or wireless information exchange between the IHS 100 and other devices (not shown).

In the depicted embodiment, the IHS 100 includes a component heat exchanger 160 that is thermally coupled to an electronic device such as the processor 110. In a particular embodiment, the component heat exchanger 160 is a heat sink that is directly mounted on the processor 110 to radiate the heat generated by the processor 110. In an exemplary, non-depicted embodiment, a thermal transfer system transfers the heat generated by rack or chassis mounted components such as the processor 110 to a central heat exchanger. Additional detail of the operation of a thermal transfer system is described with reference to FIGS. 2A, 2B, 2C and 3.

The processor 110 is operable to execute the instructions and/or operations of the IHS 100. The memory medium, e.g., RAM 120, preferably stores instructions (also known as a "software program") for implementing various embodiments of a method in accordance with the present disclosure. An operating system (OS) of the IHS 100 is a type of software program that controls execution of other software programs, referred to as application software programs. In various embodiments the instructions and/or software programs may be implemented in various ways, including procedure-based techniques, component-based techniques, and/or object-oriented techniques, among others. Specific examples include assembler, C, XML, C++ objects, Java and Microsoft's .NET technology.

Figure 2A:
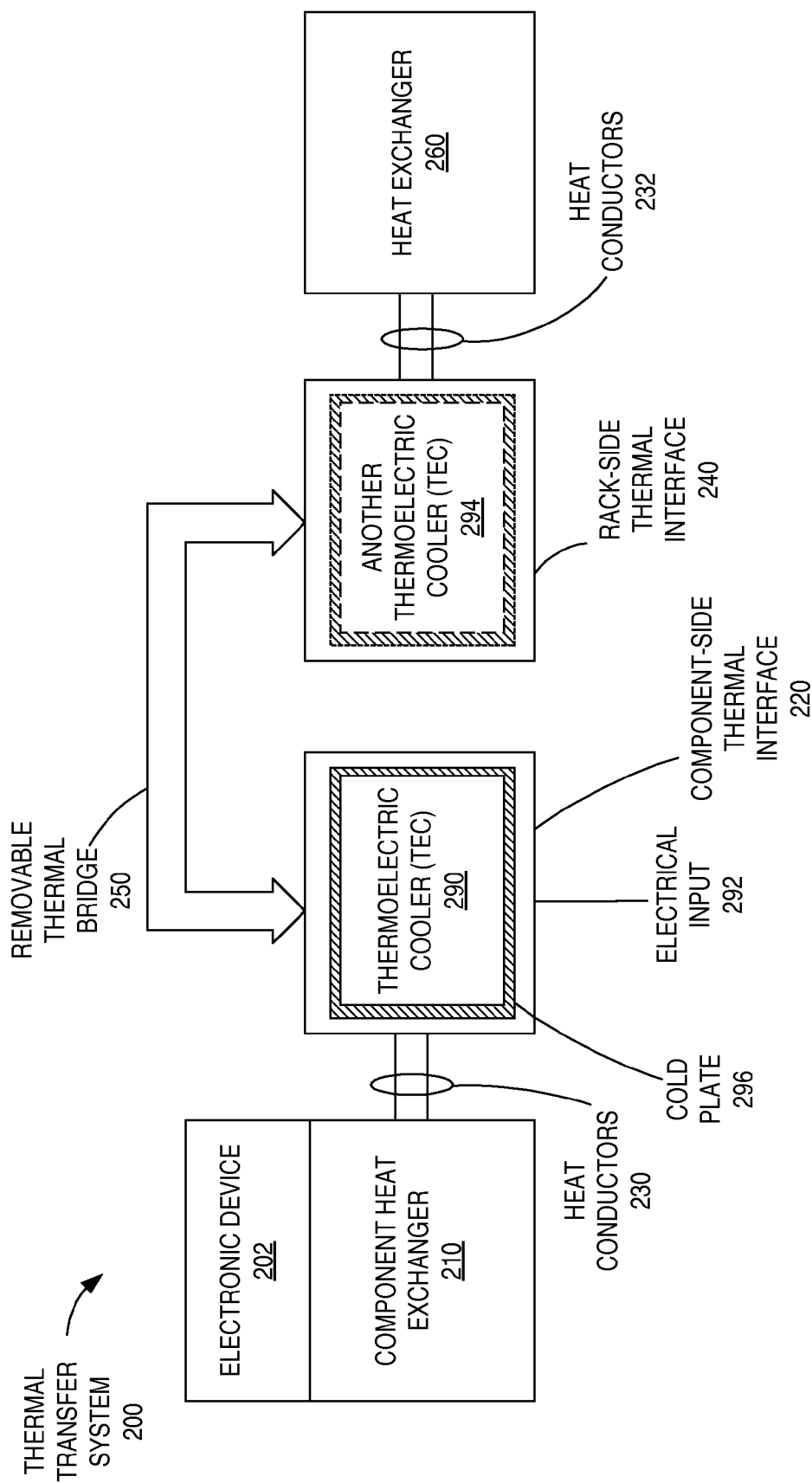
FIG. 2A illustrates a block diagram of a thermal transfer system, according to an embodiment.

FIG. 2A illustrates a block diagram of a thermal transfer system 200, according to an embodiment. In the depicted embodiment, the thermal transfer system 200 includes a component heat exchanger 210 that is thermally coupled to a component-side thermal interface 220 by one or more heat conductors 230. The heat conductors 230 may include low thermal resistance devices such as heat pipes (may be solid or may be filled with a fluid, e.g., any substance that flows including gases, vapors and/or liquids), and/or may include flexible tubing that is filled with a coolant fluid. The flexible tubing advantageously facilitates movement of electronic cards or other components for servicing the IHS 100. In a particular embodiment, the component heat exchanger 210 is substantially the same as the component heat exchanger 160 described with reference to FIG. 1. In a particular embodiment, the component heat exchanger 160 is a heat sink that is directly mounted on an electronic device 202 such as the processor 110 to radiate the heat generated by the electronic device 202.

In an embodiment, the component-side thermal interface 220 is thermally coupled to a rack-side thermal interface 240 by one or more fluid-free heat transfer mechanisms such as a removable thermal bridge 250. In an embodiment, the thermal coupling between the component-side thermal interface 220 and the rack-side thermal interface 240 may be enhanced by providing an intermediary layer (not shown) having low thermal resistance disposed in-between. Additional detail of the enhanced thermal coupling technique is described with reference to FIG. 2C. The rack-side thermal interface 240 is thermally coupled to a central cooling system and/or a heat exchanger 260 by one or more heat conductors 232. In an embodiment, the heat conductors 232 are substantially the same as the heat conductors 230. In an embodiment, the heat exchanger 260 provides cooling for an entire area such as a computer room or an information technology center.

In an embodiment, to limit exposure of electronic devices to coolant fluid, only the rack-side thermal interface 240, the heat conductors 232, and the heat exchanger 260 may come in contact with a coolant fluid, whereas the component-side thermal interface 220, the heat conductors 230, and the component heat exchanger 210 may be substantially isolated from the coolant fluid. The serviceability of the electronic devices is further improved by use of flexible tubing for the heat conductors 232, thereby enabling the rack-side thermal interface 240 to be freely moved along rails without disrupting the coolant fluid flow.

In an embodiment, a TEC 290 is placed in series with the flow of thermal energy. In the depicted embodiment, the TEC 290 may be included in, and be a part of the component-side thermal interface 220, and another optional TEC 294, which is substantially similar to the TEC 290, may be included in, and be a part of the rack-side thermal interface 240. In an exemplary, non-depicted embodiment, the TEC 290 may directly receive the heat from the component heat exchanger 210 via the heat conductors 230, and the another TEC 294 may directly provide the heat to the heat exchanger 260 via the heat conductors 232. The TEC 290 is operable to receive an electrical input 292. In response to receiving electrical energy from the electrical input 292 and the Peltier effect, the TEC 290 lowers a temperature of a device it is thermally coupled to, e.g., the component-side thermal interface 220 and/or the rack-side thermal interface 240. Lowering of the temperature results in an increase in an amount of the heat transferred between the component-side thermal interface 220 and the rack-side thermal interface 240. The increase in the amount of heat transferred is relative to the heat transferred with the TEC 290 and/or the another TEC 294. In a particular embodiment, the TEC 290 may include a cold plate 296 that provides direct contact cooling.

In an embodiment, the thermal coupling between the TEC 290 and the component-side thermal interface 220 or the rack-side thermal interface 240 may be substantially similar to the enhanced thermal coupling using an intermediary layer (not shown) having low thermal resistance disposed in-between, as described below with reference to FIG. 2C.

Figure 2B:
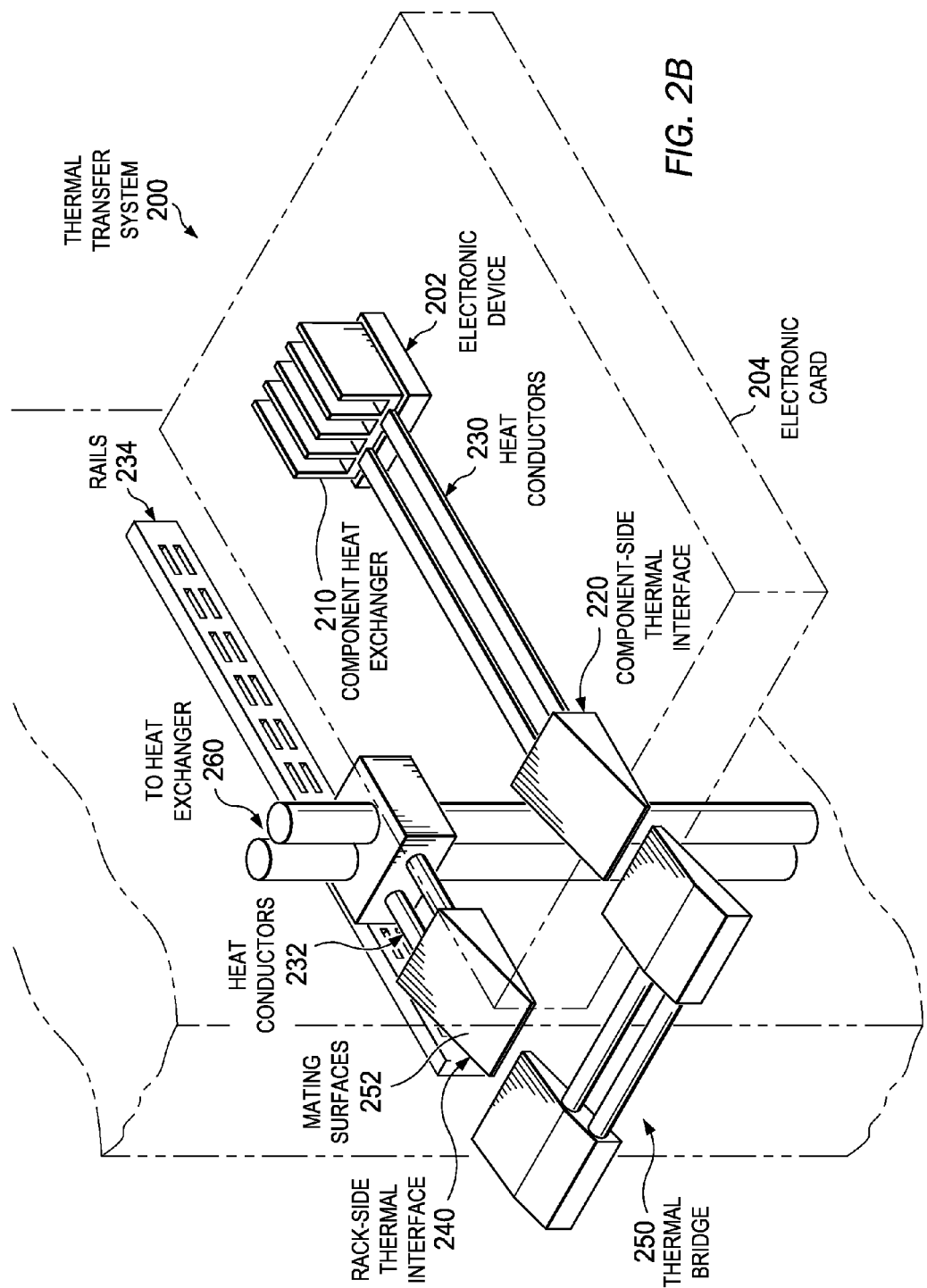
FIG. 2B illustrates a view in perspective of a thermal transfer system with a removable thermal bridge described with reference to FIG. 2A, according to an embodiment.

FIG. 2B illustrates a view in perspective of a thermal transfer system with a removable thermal bridge described with reference to FIG. 2A, according to an embodiment. In an embodiment, the thermal bridge 250 may be engaged and/or removed, thereby facilitating servicing or maintenance of an electronic board or a card 204 having one or more heat generating electronic devices such as the electronic device 202. The thermal bridge 250 includes substantially planar mating surfaces 252 for each one of the rack-side and the component-side thermal interfaces 220 and 240 to reduce thermal resistance while transferring heat between them. In an embodiment, the substantially planar mating surfaces 252 may include a cold plate (not shown) having low thermal resistance. The cold plate may circulate a coolant fluid internally to facilitate the thermal transfer. Thus, the thermal bridge 250 advantageously provides a flexible, fluid-less thermal connection that may be established or de-established easily, reliably and repeatedly between the heat generating electronic devices and the heat exchanger 260. A pair of rails 234 may be provided to facilitate movement of the rack-side thermal interface 240, heat conductors 232, and thermal connections to the heat exchanger 260.

Figure 2C:
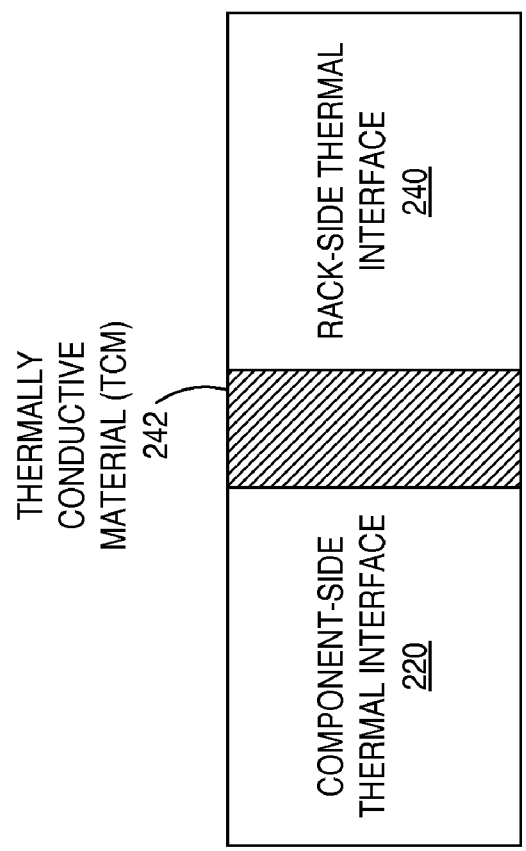
FIG. 2C illustrates a block diagram of a thermal coupling between a component-side thermal interface and a rack-side thermal interface described with reference to FIGS. 2A and 2B, according to an embodiment.

FIG. 2C illustrates a block diagram of a thermal coupling between a component-side thermal interface and a rack-side thermal interface described with reference to FIGS. 2A and 2B, according to an embodiment. In the depicted embodiment, the component-side thermal interface 220 and the rack-side thermal interface 240 are thermally coupled by a fluid-free, thermally conductive material (TCM) 242 that is disposed in-between. In an embodiment, the TCM 242, which has low thermal resistance, is selectable to be one of a thermally conductive grease, a thermally conductive paste, and a thin, thermally conductive elastomeric sheet or film. The TCM 242 advantageously fills in the gaps and spaces in-between the two substantially planar mating surfaces 252 to enhance the thermal conductivity. The TCM 242 such as the thermally conductive elastomeric sheet may be applied to one of the planar surface of the component-side thermal interface 220 or to the planar surface of the rack-side thermal interface 240. In an embodiment, the thermal coupling between the component-side thermal interface 220 and the rack-side thermal interface 240 may be enhanced by using mechanical techniques designed to ensure that the contact surfaces for the component-side thermal interface 220 and the rack-side thermal interface 240 are firmly pressed against each other by a sufficient contact force (not shown), thereby improving the thermal conductivity across the interface.

Figure 3:
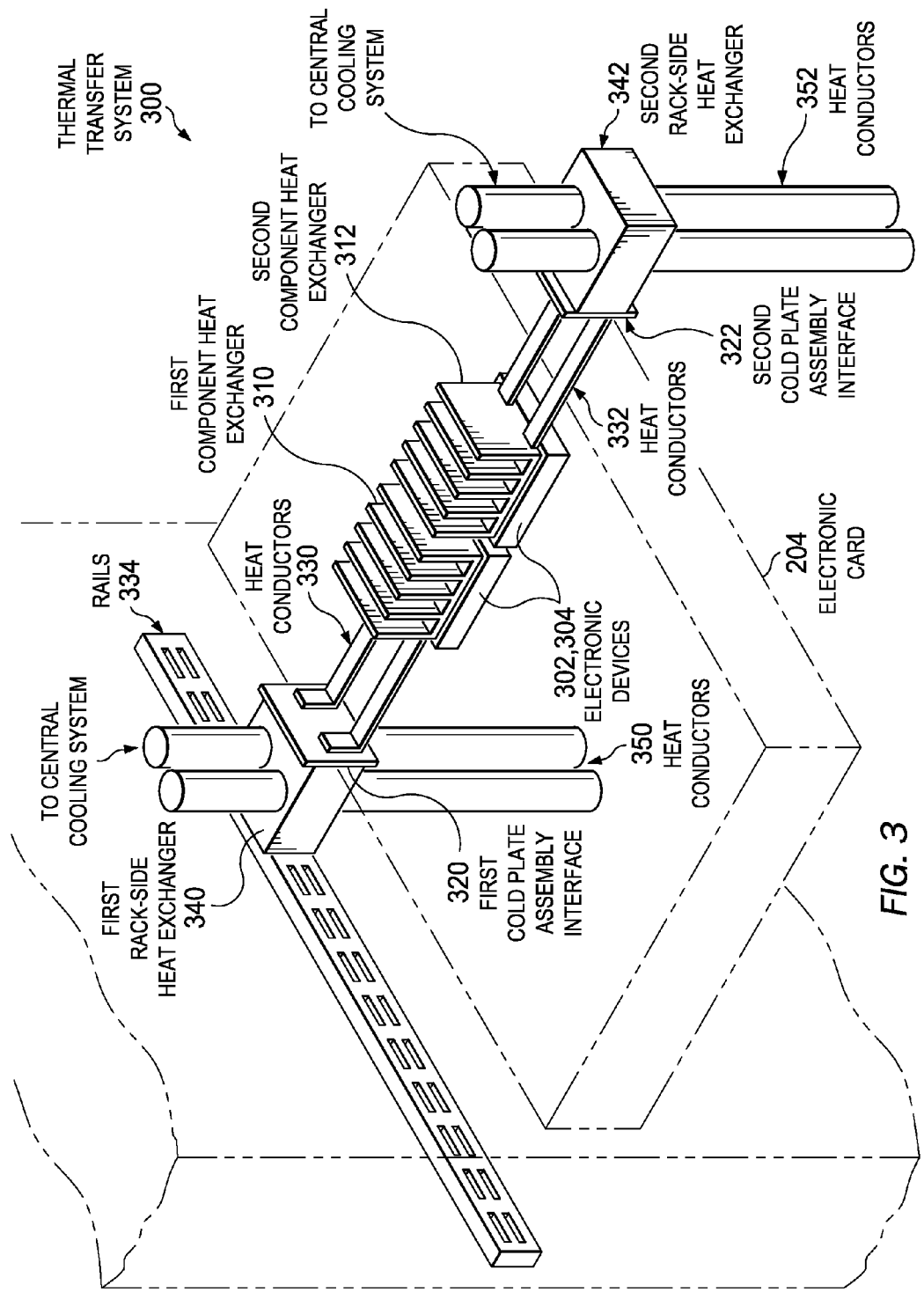
FIG. 3 illustrates a view in perspective of a thermal transfer system having multiple thermal pathways for transferring heat from multiple heat generating sources, according to an embodiment.

FIG. 3 illustrates a view in perspective of a thermal transfer system having multiple thermal pathways for transferring heat from multiple heat generating sources, according to an embodiment. In an embodiment, a thermal transfer system 300 is substantially similar to the thermal transfer system 200 described with reference to FIGS. 2A, 2B and 2C except for a number of heat generating sources and a number of thermal pathways. In the depicted embodiment, the thermal transfer system 300 includes a first component heat exchanger 310 that is thermally coupled to a first cold plate assembly interface 320, and a second component heat exchanger 312 that is thermally coupled to a second cold plate assembly interface 322. The first and second component heat exchangers 310 and 312, and the first and second cold plates 320 and 322 may be thermally coupled by alternative low thermal resistance devices such as heat pipes (may be solid or filled with a fluid, e.g., any substance that flows including gases, vapors or liquids), and/or flexible tubing filled with a coolant fluid. In a particular embodiment, each one of the first and second component heat exchangers 310 and 312 is a heat sink that is directly mounted on a corresponding electronic device 302 and 304 such as the processor 110 to radiate the heat generated by the electronic devices 302 and 304. In an exemplary, non-depicted embodiment, each one of the first and second cold plate assembly interfaces 320 and 322 may include a component-side thermal interface, a TCM, and a rack-side thermal interface as described with reference to FIG. 2C.

In an embodiment, the first and second cold plate assembly interfaces 320 and 322 are thermally coupled to a first and second rack-side heat exchangers 340 and 342 respectively. The first and second rack-side heat exchangers 340 and 342, which may be guided by a pair of rails 334 are located at either side of a rack, are thermally coupled to a central cooling system (not shown) via heat conductors 350 and 352. In an embodiment, the heat conductors 330, 332, 350 and 352 are substantially the same as the heat conductors 230 or 232 described with reference to FIGS. 2A, 2B and 2C. In an embodiment, the central cooling system provides cooling for an entire area such as a computer room or an information technology center.

In an exemplary, non-depicted embodiment, the TECs 290 and 294 are an integral part of and thermally coupled to the first and second cold plate assembly interfaces 320 and 322 respectively. As described earlier, the TECs 290 and 294 lower a temperature of a device they are thermally coupled to, e.g., the first cold plate assembly interface 320 and/or the second cold plate assembly interface 322. Lowering of the temperature results in an increase in an amount of the heat transferred between the heat sources and the central cooling system.

Figure 4:
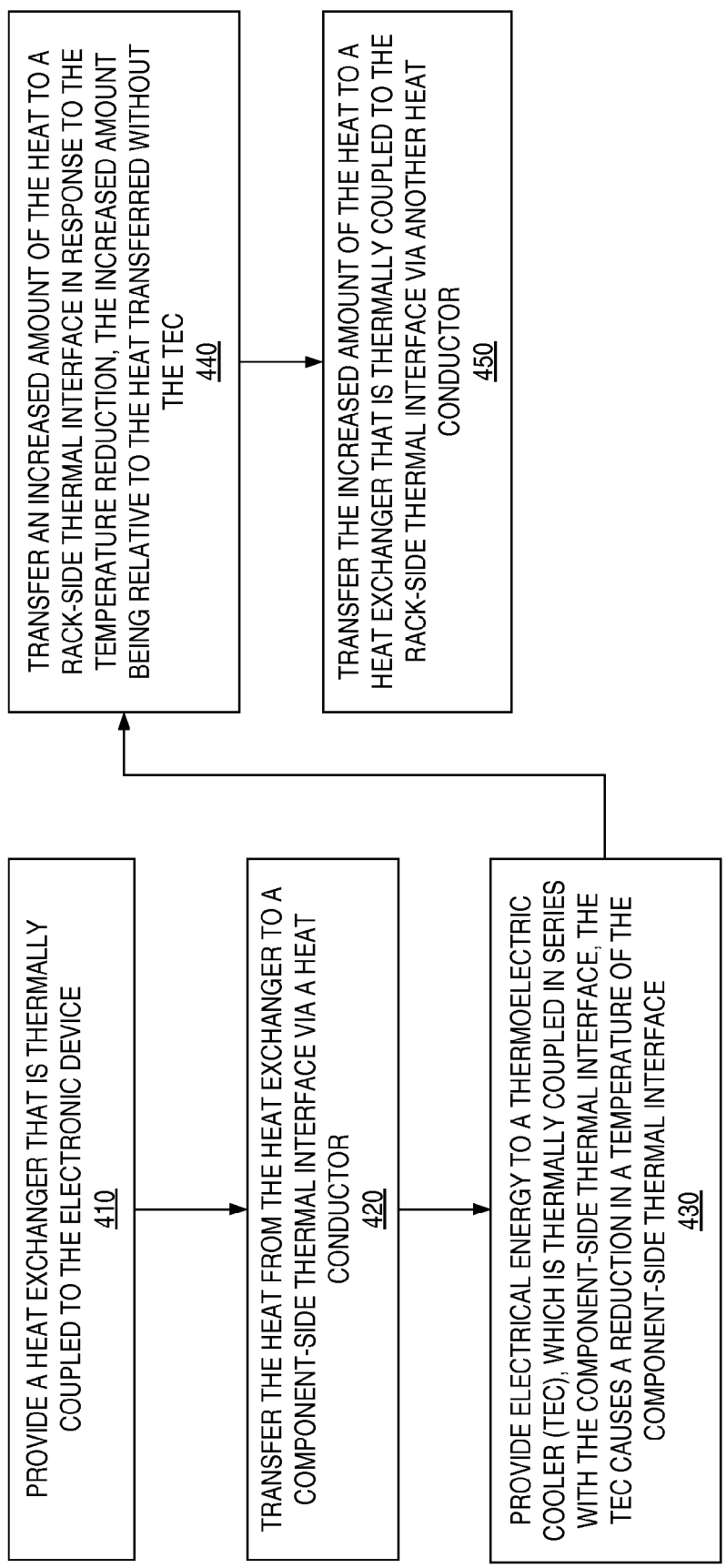
FIG. 4 is a flow chart illustrating a method for transferring heat generated by an electronic device, according to an embodiment.

FIG. 4 is a flow chart illustrating a method for transferring heat generated by an electronic device, according to an embodiment. In a particular embodiment, the electronic device is substantially the same as one of the electronic devices 202, 302 and 304 described with reference to FIGS. 2A and 3, and the heat is transferred by the thermal transfer system 200 described with reference to FIGS. 2A, 2B and 2C, or the thermal transfer system 300 described with reference to FIG. 3. At step 410, a heat exchanger that is thermally coupled to the electronic device is provided. At step 420, the heat from the heat exchanger is transferred to a component-side thermal interface via a heat conductor. At step 430, electrical energy in the form of an electrical input is provided to a TEC, which is thermally coupled to the component-side thermal interface. The electrical energy received by the TEC causes a reduction in a temperature of the component-side thermal interface. At step 440, an increased amount of the heat is transferred to a rack-side thermal interface in response to the reduction in the temperature, the rack-side thermal interface being thermally coupled to the component-side thermal interface via a thermal bridge or a thermally conductive material disposed in-between. At step 450, the increased amount of heat is transferred to a heat exchanger that is thermally coupled to the rack-side thermal interface via another heat conductor.

Various steps described above may be added, omitted, combined, altered, or performed in different orders. For example, step 450 may be altered to select the another heat conductor having a flexible tube to provide liquid cooling. The flexible tubing advantageously facilitates servicing of the electronic device.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A thermal transfer system comprising:
   a component heat exchanger thermally coupled to an electronic device, the electronic device being operable to generate heat;
   a component-side thermal interface thermally coupled to the component heat exchanger by a heat conductor;
   a rack-side thermal interface thermally coupled to the component-side thermal interface, wherein the rack-side thermal interface transfers the heat from the component-side thermal interface to a heat exchanger; and
   a thermoelectric cooler (TEC) thermally coupled in series with at least one of the component-side thermal interface and rack-side thermal interface, wherein the TEC is operable to receive an electrical input and provide an increase in an amount of the heat transferred from the electronic device to the heat exchanger compared to the heat transferred without the TEC.

2. The system of claim 1, wherein the component heat exchanger is a device heat sink, wherein the device heat sink includes a plurality of cooling fins for radiating the heat, wherein the device heat sink is thermally coupled to the heat conductor for transferring the heat.

3. The system of claim 1, wherein the transfer of the heat between the component-side thermal interface and the rack-side thermal interface is fluid-less.

4. The system of claim 1, wherein the rack-side thermal interface and the component-side thermal interface have substantially parallel planar surfaces, wherein the parallel planar surfaces are thermally coupled by a thermally conductive material (TCM) disposed in-between.

5. The system of claim 4, wherein the TCM is one of a thermally conductive grease, a thermally conductive paste, and a thermally conductive elastomeric sheet.

6. The system of claim 4, wherein the TCM is applied to the planar surface of the component-side thermal interface.

7. The system of claim 4, wherein the TCM is applied to the planar surface of the rack-side thermal interface.

8. The system of claim 1, wherein another one of a TEC is thermally coupled in series with one of the component-side thermal interface and the rack-side thermal interface that is not coupled to the TEC, wherein the another one of the TEC is operable to receive the electrical input and provide the increase in the amount of the heat transferred from the electronic device to the heat exchanger.

9. The system of claim 1, wherein the transfer of the heat from the electronic device to the heat exchanger occurs across a thermal bridge disposed between the component-side thermal interface and the rack-side thermal interface, wherein the thermal bridge is removable to service the electronic device.

10. The system of claim 1, wherein the heat conductor includes a liquid coolant contained within a flexible tube, wherein the liquid coolant transfers the heat from the device heat sink to the component-side thermal interface.

11. The system of claim 10, wherein the flexible tube permits servicing of the electronic device without interrupting a flow of the liquid coolant.

12. The system of claim 1, wherein the heat is transferred from the rack-side thermal interface to the heat exchanger by a liquid coolant contained within a flexible tube.

13. The system of claim 12, wherein the flexible tube permits servicing of the electronic device without interrupting a flow of the liquid coolant.

14. The system of claim 1, wherein the electrical input causes the TEC to lower a temperature of the component-side thermal interface, thereby increasing the amount of the heat transferred.

15. A method for transferring heat generated by an electronic device, the method comprising:
providing a heat exchanger thermally coupled to the electronic device;
transferring the heat from the heat exchanger to a component-side thermal interface via a heat conductor;
providing electrical energy to a TEC thermally coupled in series with the component-side thermal interface, wherein provision of the electrical energy to the TEC causes a reduction in a temperature of the component-side thermal interface;
transferring an increased amount of the heat in response to the reduction in the temperature, wherein the increased amount is relative to the heat transferred without the TEC;
transferring the increased amount of the heat to a rack-side thermal interface thermally coupled to the component-side thermal interface; and
transferring the increased amount of the heat to a heat exchanger thermally coupled to the rack-side thermal interface via another heat conductor.

16. The method of claim 15, wherein the transferring of the increased amount of heat occurs without a fluid exchange between the component-side thermal interface and the rack-side thermal interface.

17. The method of claim 15 further comprising:
providing the another heat conductor having a liquid coolant contained within a flexible tube, wherein the flexible tube enables a motion of the rack-side thermal interface along a rail; and
servicing the electronic device by moving the rack-side thermal interface along the rail without interrupting a flow of the liquid coolant.

18. An information handling system (IHS) comprising:
a processor;
a component heat exchanger thermally coupled to the processor, the processor operable to generate heat;
a component-side thermal interface thermally coupled to the component heat exchanger by a heat conductor;
a rack-side thermal interface thermally coupled to the component-side thermal interface, wherein the rack-side thermal interface transfers the heat from the component-side thermal interface to a heat exchanger; and
a TEC thermally coupled in series with at least one of the component-side thermal interface and rack-side thermal interface, wherein the TEC is operable to receive an electrical input and provide an increase in an amount of the heat transferred from the electronic device to the heat exchanger compared to the heat transferred without the TEC.

* * * * *